(12) United States Patent
Chuang

(10) Patent No.: US 12,374,634 B2
(45) Date of Patent: Jul. 29, 2025

(54) CHIP STRUCTURE AND SEMICONDUCTOR STRUCTURE COMPRISING AUXILIARY BONDING REGION ABOVE GUARD RING STRUCTURE

(71) Applicant: CHANGXIN MEMORY TECHNOLOGIES, INC., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 433 days.

(21) Appl. No.: 18/150,866

(22) Filed: Jan. 6, 2023

(65) Prior Publication Data

US 2023/0154867 A1 May 18, 2023

Related U.S. Application Data

(63) Continuation of application No. PCT/CN2021/137330, filed on Dec. 13, 2021.

(30) Foreign Application Priority Data

Jul. 7, 2021 (CN) .......................... 202110770973.3

(51) Int. Cl.
*H01L 23/00* (2006.01)
*H01L 23/58* (2006.01)

(52) U.S. Cl.
CPC .......... *H01L 23/562* (2013.01); *H01L 23/585* (2013.01); *H01L 24/06* (2013.01); *H01L 24/08* (2013.01); *H01L 2224/06177* (2013.01); *H01L 2224/06517* (2013.01); *H01L 2224/08145* (2013.01)

(58) Field of Classification Search
CPC ......... H01L 2224/06517; H01L 23/562; H01L 23/585; H01L 24/05; H01L 24/06; H01L 24/08; H01L 2224/08145; H01L 25/0657
USPC .......................... 257/620; 438/113, 458, 462
See application file for complete search history.

(56) References Cited

U.S. PATENT DOCUMENTS 6,184,582 B1 * 2/2001 Coult ................ H01L 23/49811
257/737
8,395,241 B2 3/2013 Yang et al.
10,388,642 B2 8/2019 Yaung et al.
(Continued)

FOREIGN PATENT DOCUMENTS

CN 102668050 A 9/2012
CN 105984837 A 10/2016
(Continued)

OTHER PUBLICATIONS

International Search Report cited in PCT/CN2021/137330 mailed Mar. 17, 2022, 8 pages.

*Primary Examiner* — Didarul A Mazumder
(74) *Attorney, Agent, or Firm* — Kilpatrick Townsend & Stockton LLP

(57) ABSTRACT

The present disclosure provides a chip structure and a semiconductor structure. The chip structure includes: a substrate; a functional region located on the substrate; a guard ring structure surrounding the functional region; and an auxiliary bonding region located above the guard ring structure, where there is an overlapping region between a projection of at least part of the auxiliary bonding region on the substrate and a projection of the guard ring structure on the substrate.

17 Claims, 9 Drawing Sheets

(56) References Cited

U.S. PATENT DOCUMENTS

| | | | | |
|---|---|---|---|---|
| 2005/0098893 A1* | 5/2005 | Tsutsue | ............... | H01L 23/5226 |
| | | | | 257/E23.142 |
| 2007/0102792 A1* | 5/2007 | Wu | ....................... | H01L 23/585 |
| | | | | 257/620 |
| 2013/0285228 A1* | 10/2013 | Montez | ................... | H01L 23/10 |
| | | | | 438/106 |
| 2014/0252642 A1* | 9/2014 | Lou | ........................ | H01L 23/48 |
| | | | | 257/773 |
| 2016/0039665 A1* | 2/2016 | Kennedy | ............ | B81C 1/00825 |
| | | | | 257/704 |
| 2016/0211248 A1* | 7/2016 | Yaung | .................... | H01L 25/50 |
| 2022/0084928 A1* | 3/2022 | Chen | ....................... | H01L 23/50 |

FOREIGN PATENT DOCUMENTS

| CN | 106024746 A | 10/2016 |
|---|---|---|
| CN | 104952747 B | 10/2018 |
| CN | 112259599 A | 1/2021 |

\* cited by examiner

CHIP STRUCTURE AND SEMICONDUCTOR STRUCTURE COMPRISING AUXILIARY BONDING REGION ABOVE GUARD RING STRUCTURE

CROSS-REFERENCE TO RELATED APPLICATIONS

This is a continuation of International Application No. PCT/CN2021/137330, filed on Dec. 13, 2021, which claims the priority to Chinese Patent Application No. 202110770973.3, titled "CHIP STRUCTURE AND SEMICONDUCTOR STRUCTURE" and filed on Jul. 7, 2021. The entire contents of International Application No. PCT/CN2021/137330 and Chinese Patent Application No. 202110770973.3 are incorporated herein by reference.

TECHNICAL FIELD

The present disclosure relates to, but is not limited to, a chip structure and a semiconductor structure.

BACKGROUND

A wafer bonding technology refers to close bonding of two mirror-polished homogeneous or heterogeneous wafers through chemical and physical actions. After the wafers are bonded, atoms at a bonding interface are reacted under an external force to form a covalent bond as a whole, and the bonding interface thus reaches a specific bonding strength.

In a wafer packaging process, the chips are arranged on wafers and separated from each other; and after the two wafers are stacked and bonded, chip units stacked together are obtained by cutting. During heterogeneous bonding of the wafers, the chips are subjected to metal bonding through pads, and are subjected to dielectric bonding through non-metallic dielectric materials. The bonding strength of the dielectric materials is lower than the metal bonding strength, and therefore, cutting and dicing are easy to cause chip layering.

SUMMARY

An overview of the subject described in detail in the present disclosure is provided below. This overview is not intended to limit the protection scope of the claims.

The present disclosure provides a chip structure and a semiconductor structure.

A first aspect of the present disclosure provides a chip structure, including:
- a substrate;
- a functional region located on the substrate;
- a guard ring structure surrounding the functional region; and
- an auxiliary bonding region located above the guard ring structure, where there is an overlapping region between a projection of at least part of the auxiliary bonding region on the substrate and a projection of the guard ring structure on the substrate.

A semiconductor structure is provided according to a second aspect of the present disclosure. The semiconductor structure includes a first chip and a second chip, where both the first chip and the second chip adopt the chip structure according to the first aspect; and
at a stack interface where the first chip and the second chip are connected, an auxiliary bonding region of the first chip is connected to an auxiliary bonding region of the second chip.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In a chip packaging process, two wafers are stacked correspondingly, chip structures on the wafers are bonded and connected, and the bonded and connected chip structures are separated by dicing the wafers using a scribe-line region, and chip particles are obtained after packaging. Regarding the heterogeneously bonded wafers, the chip structures on the two wafers are subjected to metal bonding through pads, and are subjected to dielectric bonding through non-metallic dielectric materials. The bonding strength of the dielectric materials is lower than the strength of the metal bonding, and therefore, cutting and dicing are easy to cause chip layering.

Figure 1:
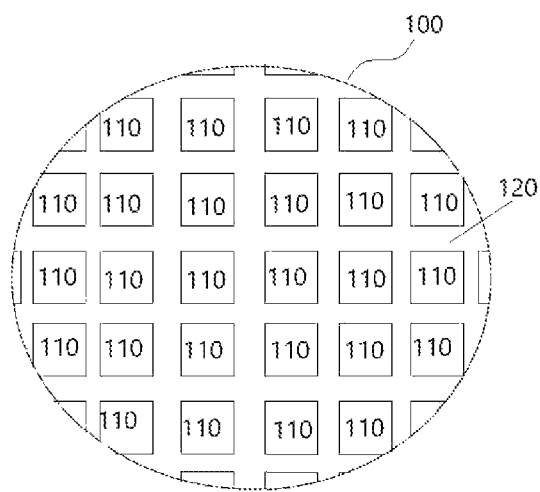
FIG. 1 is a top schematic diagram of a wafer according to one embodiment of the present disclosure.

As shown in FIG. 1, a top view of a wafer 100 according to one embodiment is illustratively shown. Several chip structures 110 are arranged on the wafer 100 at intervals, and a scribe-line region 120 is formed between adjacent two of the chip structures 110.

Figure 2:
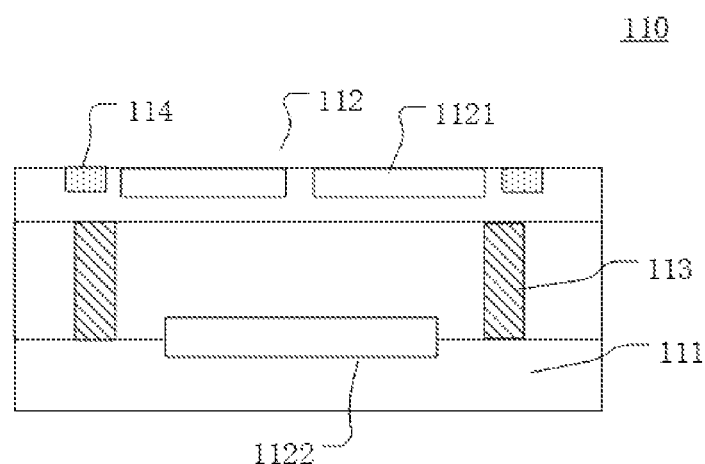
FIG. 2 is a schematic cross-sectional diagram of a chip structure according to one exemplary embodiment of the present disclosure.

As an exemplary embodiment of the present disclosure, as shown in FIG. 2, the chip structure 110 includes a substrate 111 and a functional region 112 located on the substrate 111. The substrate 111 of the chip structure may be a semiconductor substrate, and for example, may be a silicon substrate, a silicon-germanium substrate, a carbon-silicon substrate, or the like. The functional region 112 of the chip structure includes a memory cell, and the memory cell may be a dynamic random access memory (DRAM) cell, a static random access memory (SRAM) cell, a magnetic random access memory (MRAM) cell, or the like.

The chip structure further includes: a guard ring structure 113 surrounding the functional region 112; and an auxiliary bonding region 114 located above the guard ring structure 113, where there is an overlapping region between a projection of at least part of the auxiliary bonding region 114 on the substrate 111 and a projection of the guard ring structure 113 on the substrate 111. For example, the projection region of the auxiliary bonding region 114 on the substrate 111 totally falls within the projection region of the guard ring structure 113 on the substrate 111. For another example, the projection region of the auxiliary bonding region 114 on the substrate 111 partially overlaps with the projection region of the guard ring structure 113 on the substrate 111. For another example, the projection region of the auxiliary bonding region 114 on the substrate 111 covers the projection region of the guard ring structure 113 on the substrate 111.

In the chip structure 110 of this embodiment, the auxiliary bonding region 114 is additionally arranged in the peripheral region surrounding the functional region 112. By arranging the auxiliary bonding region 114, in the subsequent packaging process, the stacked chips can still be tightly bonded during the cutting process of the stacked chip structure to avoid chip layering.

Figure 3:
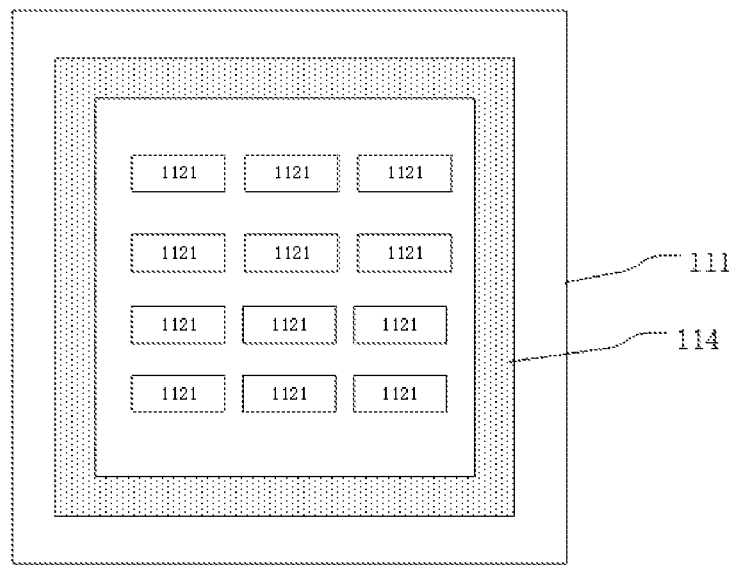
FIG. 3 is a top schematic diagram of a chip structure according to one exemplary embodiment of the present disclosure.

As shown in FIG. 2 and FIG. 3, the functional region 112 of the chip structure at least includes internal bonding regions 1121 distributed on the surface of the substrate 111, and a circuit structure 1122 provided in the chip structure. The internal bonding regions 1121 are electrically connected to the circuit structure 1122 (not shown in the figures).

In this embodiment, referring to FIG. 2, the auxiliary bonding region 114 is correspondingly arranged above the guard ring structure 113, that is, arranged in the peripheral region surrounding the functional region 112. In the packaging process, the chip structure 110 in this embodiment is bonded to the corresponding chip structure by alignment. That is, the auxiliary bonding region 114 in the chip structure 110 is bonded to the auxiliary bonding region in the corresponding chip structure, the internal bonding regions 1121 in the chip structure 110 are bonded to the internal bonding regions in the corresponding chip structure, and the auxiliary bonding region 114 may be subjected to metal bonding or non-metallic bonding outside the internal bonding regions 1121. The auxiliary bonding region 114 increases the bonding strength of the peripheral region of the functional region 112 to avoid layering of the stacked chips when the stacked chip structure is cut and diced during the packaging process.

Figure 4:
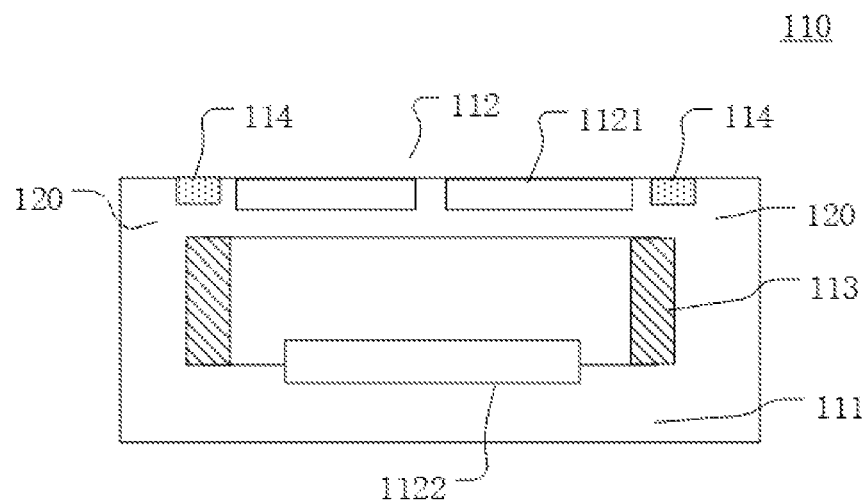
FIG. 4 is a schematic cross-sectional diagram of a chip structure according to one exemplary embodiment of the present disclosure.

In an embodiment of the present disclosure, as shown in FIG. 4, most of the structures of the chip structure 110 in this embodiment are the same as those in the above embodiment, and the differences are that the chip structure 110 further includes a scribe-line region 120, and the guard ring structure 113 is located between the functional region 112 and the scribe-line region 120. The projection of part of the auxiliary bonding region 114 on the substrate 111 overlaps with the projection of the scribe-line region 120 on the substrate.

Figure 5:
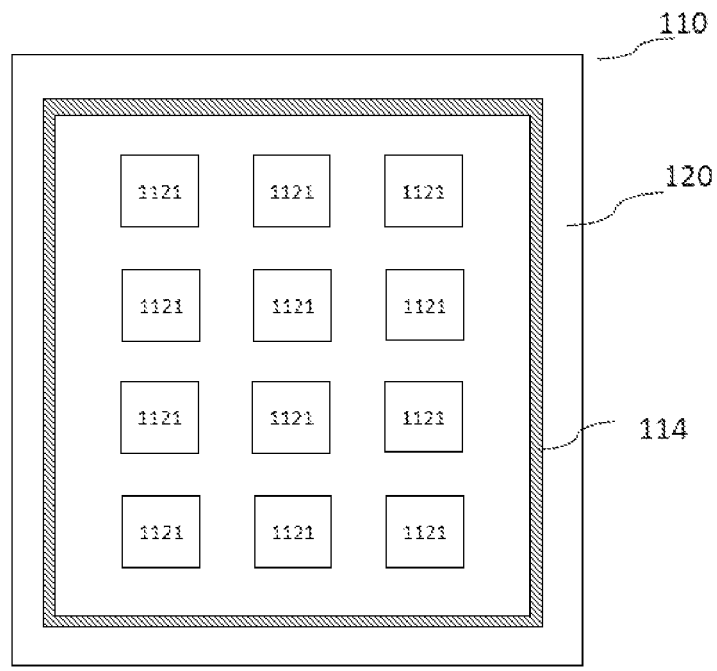
FIG. 5 is a top schematic diagram of a chip structure according to one exemplary embodiment of the present disclosure.

As shown in FIG. 5, the auxiliary bonding region 114 is arranged in the peripheral region of the internal bonding regions 1121, and part of the auxiliary bonding region 114 is correspondingly arranged on the scribe-line region 120. That is, the auxiliary bonding region 114 is arranged on the edge of the chip structure 110 and extends to the peripheral region of the guard ring structure.

As shown in FIG. 4 and FIG. 5, the functional region 112 of the chip structure 110 at least includes the internal bonding regions 1121 arranged on the surface of the substrate 111 at intervals, and the circuit structure 1122 provided in the chip structure. The internal bonding regions 1121 are electrically connected to the circuit structure 1122 (not shown in the figures). In this embodiment, the internal bonding regions 1121 may be metal pads, and the auxiliary bonding region 114 may also be a metal pad.

In the wafer packaging process, referring to FIG. 4, the chip structure 110 in this embodiment is bonded to the corresponding chip structure by alignment to form the stacked chip structure. That is, the internal bonding regions 1121 in the chip structure 110 and the internal bonding regions in the corresponding chip structure are subjected to metal bonding, the auxiliary bonding region 114 in the chip structure 110 and the auxiliary bonding region in the corresponding chip structure are subjected to metal bonding, and the scribe-line region 120 in the chip structure 110 is bonded to the scribe-line region in the corresponding chip structure. The auxiliary bonding region 114 increases the bonding strength of the peripheral region of the internal bonding regions 1121, such that the edge region of the stacked chip structure has excellent bonding strength, to avoid layering due to low bonding strength of the edge region of the stacked chip structure during cutting and dicing in the packaging process.

Figure 6:
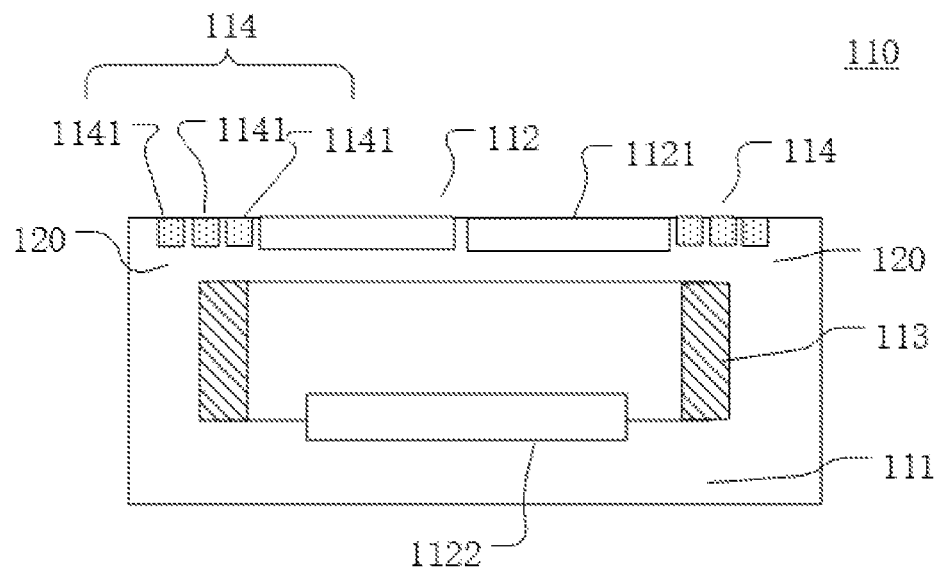
FIG. 6 is a schematic cross-sectional diagram of a chip structure according to one exemplary embodiment of the present disclosure.
Figure 7:
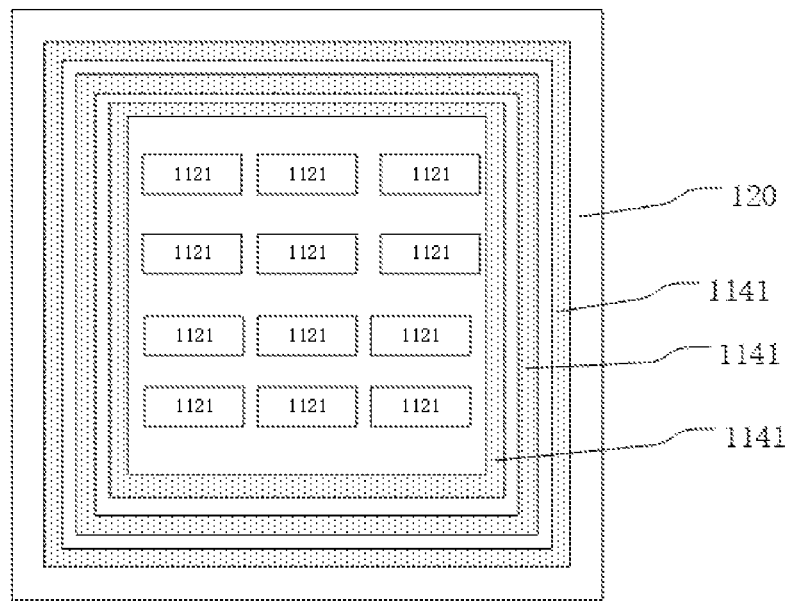
FIG. 7 is a top schematic diagram of a chip structure according to one exemplary embodiment of the present disclosure.

In an embodiment of the present disclosure, as shown in FIG. 6 and FIG. 7, most of the structures of the chip structure 110 in this embodiment are the same as those in the above embodiment, and the differences are that the chip structure 110 includes the guard ring structure 113 and the auxiliary bonding region 114, and the guard ring structure 113 surrounds the functional region 112 and is located between the functional region 112 and the scribe-line region 120. The auxiliary bonding region 114 is located above the guard ring structure 113, where there is an overlapping region between the projection of at least part of the auxiliary bonding region 114 on the substrate 111 and the projection of the guard ring structure 113 on the substrate 111. The auxiliary bonding region 114 includes a plurality of bonding portions 1141, where there is an overlapping region between a projection of one part of the bonding portions 1141 on the substrate 111 and a projection of the guard ring structure 113 on the substrate 111; and a projection of the other part of the bonding portions 1141 on the substrate 111 overlaps with the projection of the scribe-line region 120 on the substrate 111.

As shown in FIG. 7, in the top view of the chip structure 110, in this embodiment, the bonding portions 1141 surround the functional region 112, the plurality of bonding portions 1141 are sequentially encircled from inside to outside, and at least one of the bonding portions 1141 is arranged around the substrate 111 in a region where the scribe-line region 120 is located, such that in the packaging process, the chip structure 110 in this embodiment and the corresponding chip structure are stacked for bonding by alignment to form the stacked chip structure. On the stack interface of the stacked chip structure, the internal bonding regions of the chip structure 110 are tightly connected to the edge regions of the internal bonding regions in the corresponding chip structure by metal bonding, and the scribe-line region 120 is also tightly connected by metal bonding, thereby further reducing the influence of the scribe-line region on the stacked chip structure during dicing.

Figure 8:
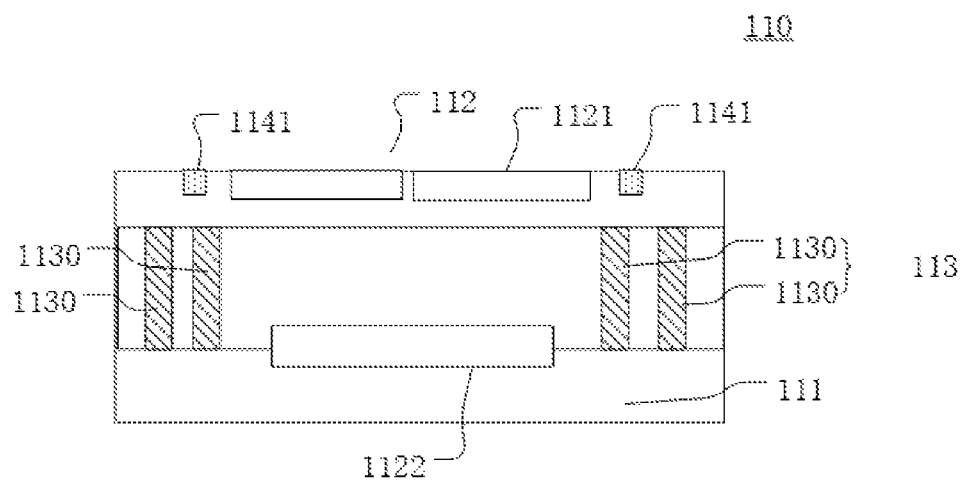
FIG. 8 is a schematic cross-sectional diagram of a chip structure according to one exemplary embodiment of the present disclosure.

In an embodiment of the present disclosure, as shown in FIG. 8, most of the structures of the chip structure 110 in this embodiment are the same as those in the above embodiment, and the differences are that the guard ring structure 113 includes at least a circle of ring bodies 1130, the auxiliary bonding region 114 includes a bonding portion 1141, where there is an overlapping region between a projection of one or more of the ring bodies 1130 on the substrate and a projection of the bonding portion 1141 on the substrate. In this embodiment, there are two ring bodies 1130, and in another embodiment, there may also be one, three, four, or five ring bodies 1130. The number of the bonding portions 1141 may be less than the number of the ring bodies 1130. For example, there are three ring bodies 1130, there are two bonding portions 1141, the two bonding portions 1141 and two of the three ring bodies 1130 are arranged correspondingly. For another example, there are two ring bodies 1130, there are also two bonding portions 1141, the two ring bodies 1130 and the two bonding portions 1141 are arranged in one-to-one correspondence.

Referring to FIG. 8, when the guard ring structure 113 includes more than one circles of ring bodies 1130, the more than one circles of ring bodies 1130 jointly constitute the guard ring structure 113. That is, a region between adjacent two of the ring bodies 1130 also belongs to the guard ring structure 113. The ring bodies 1130 are arranged around the periphery of the functional region 112 to protect the functional region 112, to prevent the functional region 112 from being damaged by cutting during the packaging process. In this embodiment, at least part of the auxiliary bonding region 114 is arranged directly above the ring bodies 1130.

Figure 9:
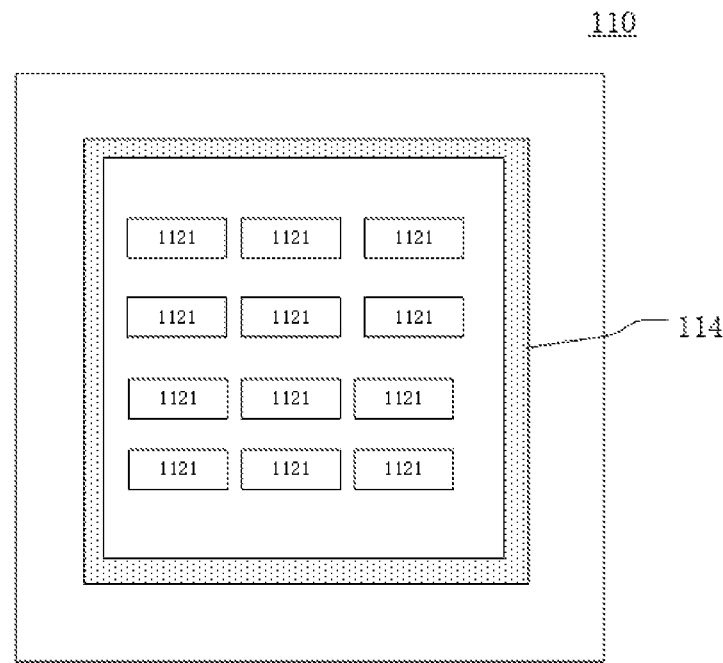
FIG. 9 is a top schematic diagram of a chip structure according to one exemplary embodiment of the present disclosure.

As shown in FIG. 9, in the top view of the chip structure 110, the projection of the auxiliary bonding region 114 is a closed ring surrounding the internal bonding regions 1121. In this embodiment, the auxiliary bonding region 114 may be a metal bonding region.

In the wafer packaging process, referring to FIG. 9, the chip structure 110 in this embodiment and the auxiliary bonding region 114 of the corresponding chip structure 110 are subjected to metal bonding having higher bonding strength in the circumferential direction outside the internal bonding regions 1121, and the bonding strength of the peripheral region of the internal bonding regions 1121 of the chip structure 110 is average. When the wafers are cut and diced, the peripheral region of the chip structure 110 is equally affected by the cutting action, such that the peripheral region of the internal bonding regions 1121 is prevented from being partially layered by the cutting action.

Figure 10:
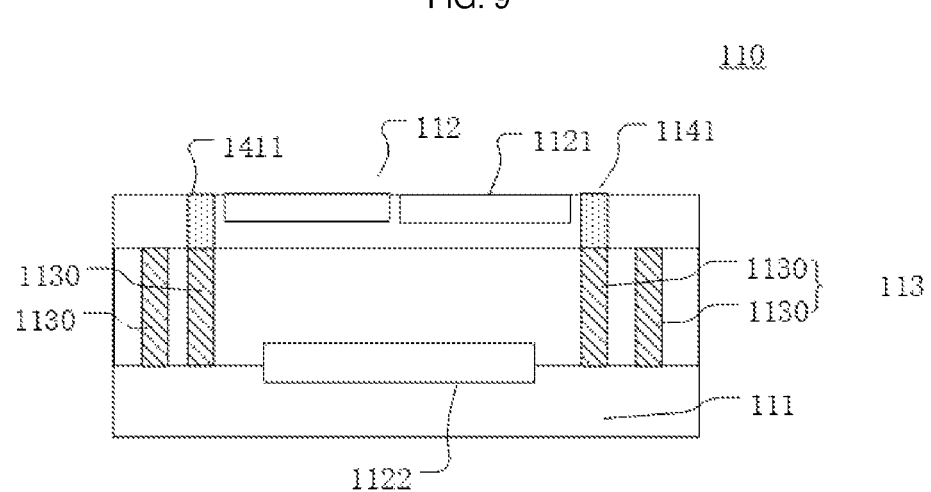
FIG. 10 is a schematic cross-sectional diagram of a chip structure according to one exemplary embodiment of the present disclosure.

In an embodiment of the present disclosure, as shown in FIG. 10, most of the structures of the chip structure 110 in this embodiment are the same as those in the above embodiment, and the differences are that the guard ring structure 113 includes at least a circle of ring bodies 1130, and the auxiliary bonding region includes a bonding portion 1141, where there is an overlapping region between the projection of one or more of the ring bodies 1130 on the substrate and the projection of the bonding portion on the substrate.

Referring to FIG. 10, the bonding portion 1141 includes a first connecting portion 1411 extending along the thickness direction of the substrate 111, where the first connecting portion 1411 is provided with one end connected to the ring bodies 1130 and the other end including a bonding surface.

As shown in FIG. 8, FIG. 9, and FIG. 10, when the auxiliary bonding region 114 includes more than one bonding portions 1141, the bonding portions 1141 are arranged on at least one of the ring bodies 1130. For example, when the auxiliary bonding region 114 includes a plurality of bonding portions 1141, and the guard ring structure 113 includes one ring body 1130, one bonding portion 1141 in the auxiliary bonding region 114 is arranged on the ring body 1130, and the remaining bonding portions 1141 are arranged in the substrate 111. For another example, when the auxiliary bonding region 114 includes a plurality of bonding portions 1141, and the guard ring structure 113 includes a plurality of ring bodies 1130, the bonding portions 1141 are correspondingly arranged on one or more ring bodies 1130 in a plurality of substrates, and the remaining bonding portions 1141 are arranged in the substrate 111.

Referring to FIG. 10, the first connecting portion 1411 of the bonding portion 1141 is provided with one end arranged on the ring body 1130 of the guard ring structure 113 and the other end extending to the surface of the chip structure 110 to form the bonding surface, and the bonding portion 1141 is used as a part of the guard ring structure 113, such that when the bonding capability of the peripheral region of the functional region 112 is improved, the bonding portion 1141 and the ring body 1130 jointly constitute the guard ring structure, the height of the guard ring structure is increased, and the protection effect of the guard ring structure can also be improved.

Figure 11:
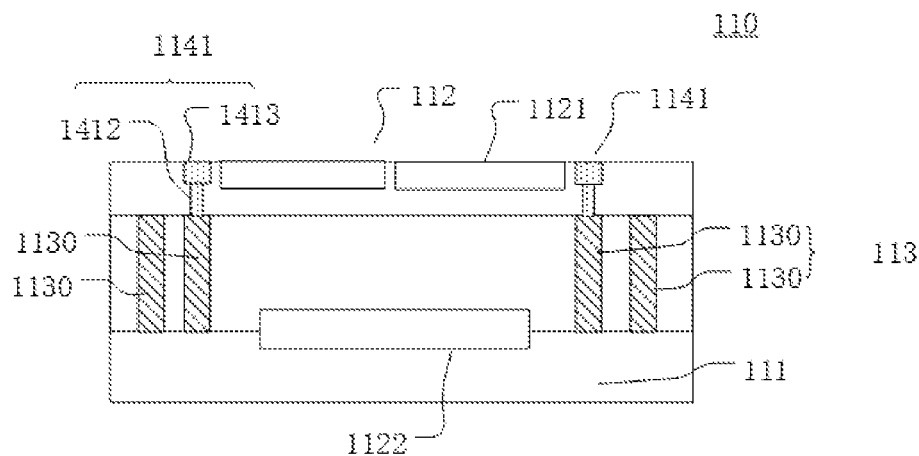
FIG. 11 is a schematic cross-sectional diagram of a chip structure according to one exemplary embodiment of the present disclosure.

In an embodiment of the present disclosure, as shown in FIG. 11, most of the structures of the chip structure 110 in this embodiment are the same as those in the above embodiment, and the differences are that in this embodiment, the guard ring structure 113 includes at least a circle of ring bodies 1130, and the auxiliary bonding region 114 (referring to FIG. 9) includes a bonding portion 1141, where there is an overlapping region between the projection of one or more of the ring bodies 1130 on the substrate and the projection of the bonding portion 1141 on the substrate.

Referring to FIG. 11, the bonding portion 1141 includes a second connecting portion 1412 extending along the thickness direction of the substrate 111, and a connecting layer 1413 parallel to the substrate, where the second connecting portion 1412 is provided with one end connected to the ring body 1130 and the other end connected to the connecting layer 1413, and the connecting layer 1413 includes a bonding surface located on the side of the connecting layer 1413 distant from the second connecting portion 1412.

Referring to FIG. 11, when the auxiliary bonding region 114 (referring to FIG. 9) includes more than one bonding portions 1141, and the guard ring structure 113 includes one ring body 1130, one of the bonding portions 1141 is arranged on the ring body 1130 of the guard ring structure 113, each bonding portion 1141 includes a second connecting portion 1412 connected to the ring body 1130 and a connecting layer 1413 connected to the second connecting portion 1412, the bonding surface is formed on the side of the connecting layer 1413 distant from the second connecting portion 1412, and the remaining auxiliary bonding regions 114 are arranged in the substrate 111. When the auxiliary bonding region 114 includes more than one bonding portions 1141, and the guard ring structure 113 includes a plurality of ring bodies 1130, the bonding portions 1141 are correspondingly arranged on one ring body 1130 in a plurality of substrates, each bonding portion 1141 includes a second connecting portion 1412 connected to the ring body 1130, and the remaining bonding portions 1141 are arranged in the substrate 111. Or, when the auxiliary bonding region 114 includes more than one bonding portions 1141, and the guard ring structure 113 includes a plurality of ring bodies 1130, the bonding portions 1141 are correspondingly arranged on more than two ring bodies 1130 in a plurality of substrates, and at least one of more than two bonding portions 1141 arranged on the ring bodies 1130 includes a second connecting portion 1412 connected to the ring body 1130.

Referring to FIG. 11, the projection of the connecting layer 1413 on the substrate 111 may be located within the projection of the ring body 1130 on the substrate 111; or the projection of the connecting layer 1413 on the substrate 111 may also completely or partially cover the projection of the ring body 1130 on the substrate 111. That is, the width of the connecting layer 1413 may be greater than the width of the ring body 1130, or the same as that of the ring body 1130, or less than the width of the ring body 1130. In this embodiment, the connecting layer 1413 is as wide as the ring body 1130.

Referring to FIG. 11, in this embodiment, the bonding portion 1141 is arranged on at least one ring body 1130 of the guard ring structure 113, and the connecting layer 1413 of the bonding portion 1141 extends to the surface of the chip structure 110 to form the bonding surface, thereby improving the bonding capability of the peripheral region of the functional region 112. Moreover, by arranging the bonding portion 1141, the height of the ring body 1130 is increased, and the protection effect of the ring body 1130 can also be improved.

Figure 12:
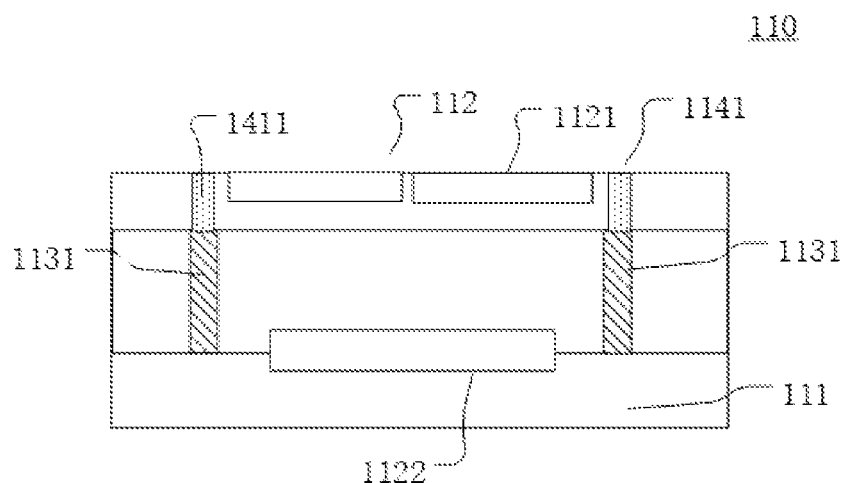
FIG. 12 is a schematic cross-sectional diagram of a chip structure according to one exemplary embodiment of the present disclosure.

In an embodiment of the present disclosure, as shown in FIG. 12, most of the structures of the chip structure 110 in this embodiment are the same as those in the above embodiment, and the differences are that the bonding portion 1141 includes a first connecting portion 1411 extending along the thickness direction of the substrate 111, where the first connecting portion 1411 is provided with one end connected to the ring bodies 1130 and the other end including a bonding surface.

Figure 13:
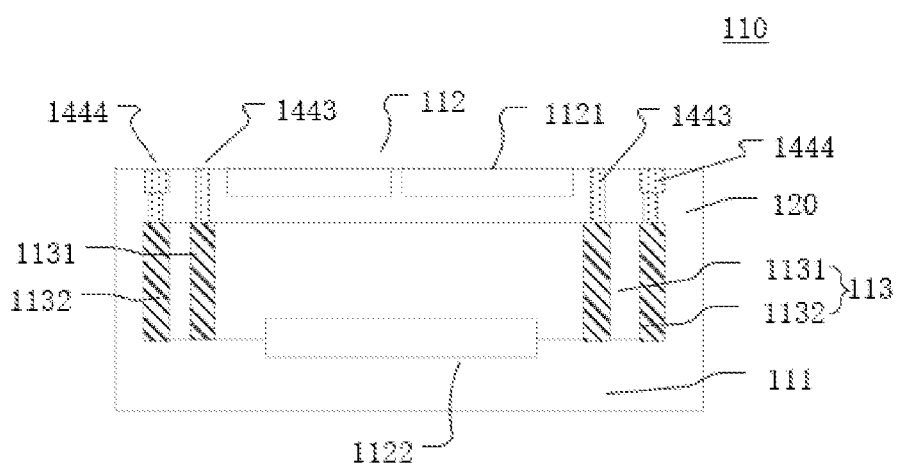
FIG. 13 is a schematic cross-sectional diagram of a chip structure according to one exemplary embodiment of the present disclosure.

Referring to FIG. 13, the guard ring structure 113 includes a plurality of ring bodies, and the plurality of ring bodies include a first ring body 1131 arranged adjacent to the functional region 112. The bonding portion 1141 corresponding to the first ring body 1131 includes a first connecting layer 1443 spaced apart from the internal bonding regions 1121 of the functional region 112.

Referring to FIG. 13, the plurality of ring bodies of the guard ring structure 113 sequentially surround the functional region from inside to outside to provide multiple protections for the functional region 112 of the chip, where the ring body of the guard ring structure 113 located on the innermost side, namely the ring body closest to the functional region 112 of the chip is the first ring body 1131, and the inner side of the first ring body 1131 is adjacent to the functional region 112. The first connecting layer 1443 configured to enhance the bonding capability of the peripheral region of the functional region 112 is correspondingly arranged on the first ring body 1131, and the first connecting layer 1443 is spaced apart from the internal bonding regions 1121 of the functional region 112 to avoid short circuit of the circuit structure 1122 of the functional region 112 due to contact with the internal bonding regions 1121. In this embodiment, there are at least two ring bodies. For example, there may be two, three, four, or five ring bodies. The chip structure 110 includes at least one bonding portion 1141, one bonding portion 1141 is arranged on the first ring body 1131, and the remaining bonding portions 1141 may be arranged on other ring bodies or in the substrate 111.

Referring to FIG. 13, in this embodiment, the projection region of the first connecting layer 1443 on the substrate 111 is located within the projection region of the first ring body 1131 on the substrate 111. That is, the first connecting layer 1443 in this embodiment is narrower than the first ring body 1131 to avoid short circuit of the first connecting layer 1443 due to contact with the internal bonding regions 1121 of the functional region 112.

Figure 14:
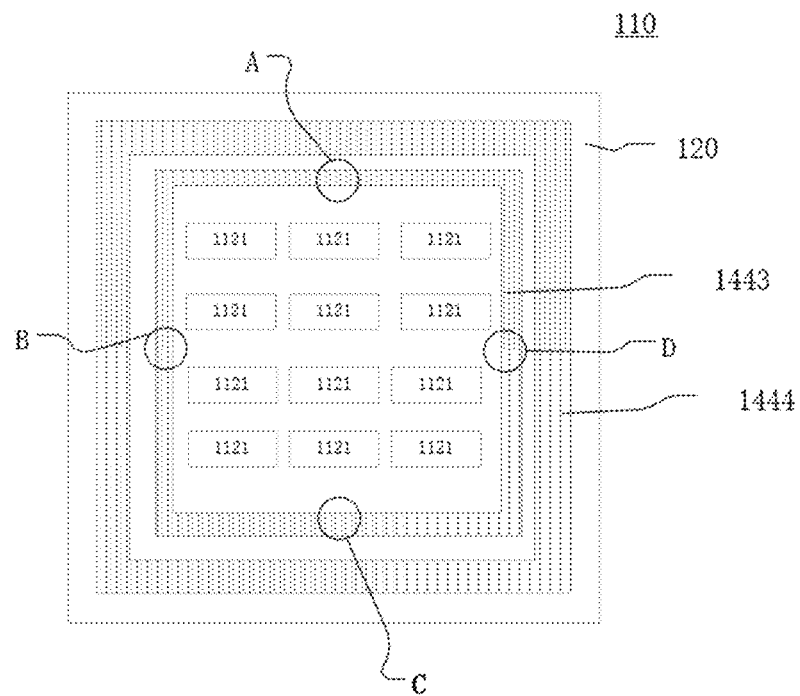
FIG. 14 is a top schematic diagram of a chip structure according to one exemplary embodiment of the present disclosure.

In an embodiment of the present disclosure, as shown in FIG. 13 and FIG. 14, most of the structures of the chip structure 110 in this embodiment are the same as those in the above embodiment, and the differences are that the guard ring structure 113 further includes a second ring body 1132 arranged adjacent to the scribe-line region 120; and the bonding portion corresponding to the second ring body 1132 includes a second connecting layer 1444 connected to the scribe-line region 120.

Referring to FIG. 13, in this embodiment, the guard ring structure 113 at least includes a first ring body 1131 and a second ring body 1132. The guard ring structure 113 may include more than three ring bodies. When the guard ring structure 113 includes more than three ring bodies, at least one ring is additionally arranged between the first ring body 1131 and the second ring body 1132. For example, one, two, or three ring bodies are additionally arranged between the first ring body 1131 and the second ring body 1132.

In some embodiments of the present disclosure, referring to FIG. 13, the projection area of the second connecting layer 1444 on the substrate 111 is greater than the projection area of the first connecting layer 1443 on the substrate 111. Along the width direction of the guard ring structure 113, a size of the second connecting layer 1444 is greater than a size of the first connecting layer 1443.

Referring to FIG. 13, the projection of the first connecting layer 1443 is narrower than the projection of the first ring body 1131, the first connecting layer 1443 is spaced apart from the internal bonding regions 1121 of the functional region 112, and the first connecting layer 1443 is narrower than the first ring body 1131 to avoid short circuit of the first connecting layer 1443 due to contact with the internal bonding regions 1121 of the functional region 112. The projection of the second connecting layer 1444 is as wide as the projection of the second ring body 1132, such that when the chip structure 110 in this embodiment and the corresponding chip structure are stacked for bonding by alignment to form the stacked chip structure, the metal bonding area formed by the second connecting layer 1444 at the stack interface is increased.

Referring to FIG. 13, since the first connecting layer 1443 is spaced apart from the internal bonding regions 1121, the first connecting layer 1443 is relatively narrow, and the bonding capability of the first connecting layer 1443 is relatively weak. In some embodiments of the present disclosure, to increase the bonding area of the first connecting layer 1443, the bonding portion on the first ring body 1131 (not shown in the figure) includes a plurality of regular bending units connected end to end, to increase the bonding area of the first connecting layer 1443 and increase the bonding strength of the first connecting layer 1443.

Figure 15:
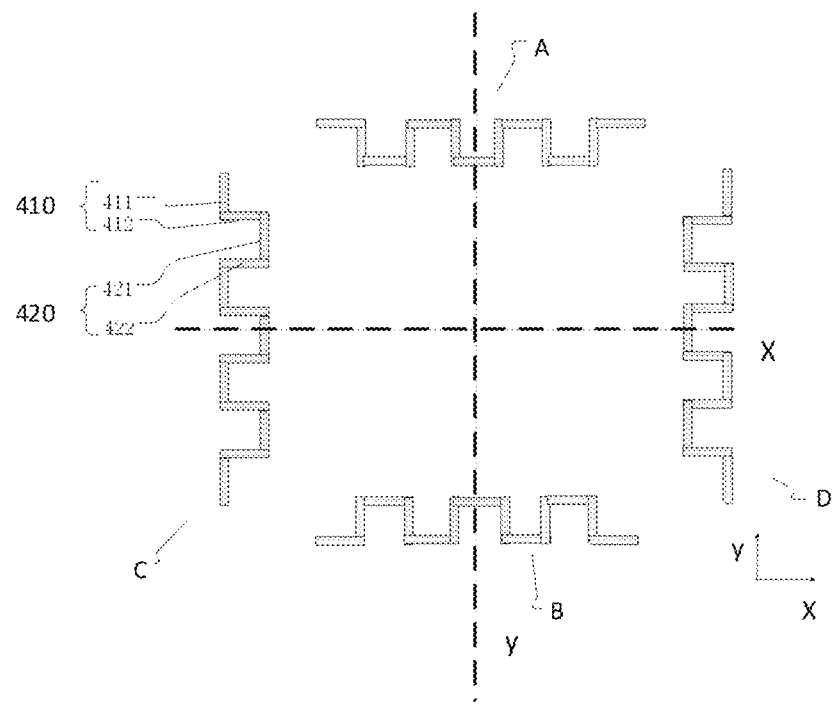
FIG. 15 is a partial enlarged view of four positions A, B, C, and D in FIG. 14.

As shown in FIG. 14 and FIG. 15, in some embodiments of the present disclosure, in the top view of the chip structure 110, the bonding portion on the first ring body 1131 (not shown in the figure) includes a first bending unit 410 and a second bending unit 420 sequentially connected end to end. The first bending unit 410 includes a first section 411 extending along a first direction and a second section 412 extending along a second direction, and a first end of the second section 412 is connected to a second end of the first section 411. The second bending unit 420 includes a third section 421 extending along the first direction and a fourth section 422 extending along the second direction, and a first end of the fourth section 422 is connected to a second end of the third section 421. The second end of the second section 412 of the first bending unit 410 is connected to the first end of the third section 421 of the second bending unit 420, and the second end of the fourth section 422 of the second bending unit 420 is connected to the first end of the first section 411 of the following first bending unit 410. In this embodiment, as shown in FIG. 15, the first direction is perpendicular to the second direction, and the projection of the bonding portion on the first ring body 1131 is configured as a bent serpentine shape. In other embodiments of the present disclosure, the projection of the bonding portion on the first ring body 1131 may be configured as a continuously bent zigzag shape or other shapes.

Referring to FIG. 14 and FIG. 15, in the embodiments of the present disclosure, the substrate 111 of the chip structure 110 has a center line. To ensure the same bonding capability around the chip structure 110 and avoid local layering caused by cutting during cutting, the auxiliary bonding regions 114 located on both sides of the center line are symmetrically arranged with the center line as a symmetry axis.

For example, FIG. 15 is a partially enlarged view of four positions A, B, C, and D in FIG. 14, where the positions A and B are located on the center line of the chip in the first direction (x direction), and the positions C and D are located on the center line of the chip in the second direction (y direction). As shown in FIG. 15, the auxiliary bonding regions 114 (not shown in the figure) on the chip structure 110 are arranged mirror-symmetrically, the projections of the positions A and B of the bonding portion on the first ring body 1131 (not shown in the figure) are mirror-symmetrical with the center line of the first direction as the axis, and the projections of the positions C and D of the bonding portion on the first ring body 1131 are mirror-symmetrical with the center line of the second direction as the axis.

Figure 16:
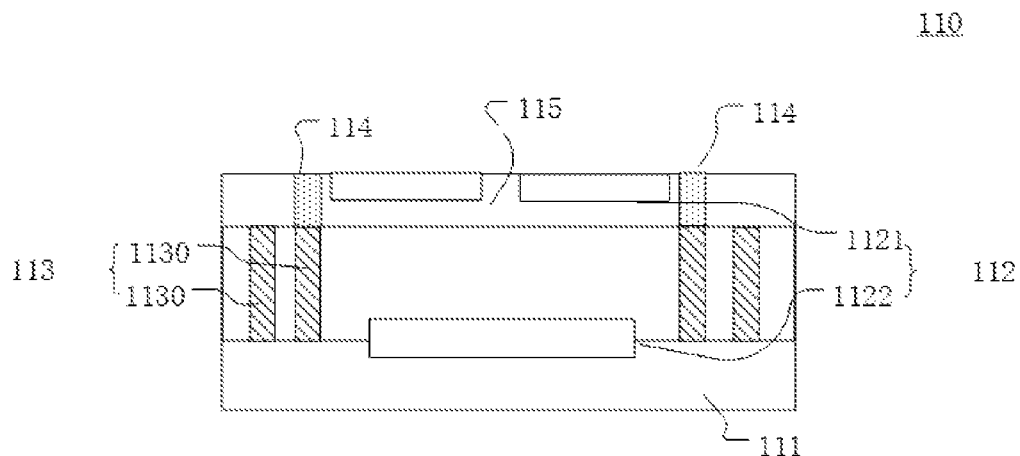
FIG. 16 is a schematic cross-sectional diagram of a chip structure according to one exemplary embodiment of the present disclosure.
Figure 17:
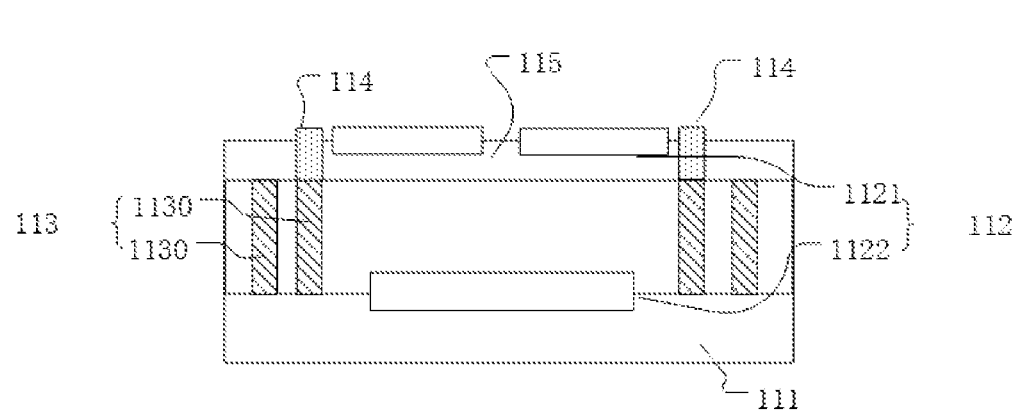
FIG. 17 is a schematic cross-sectional diagram of a chip structure according to one exemplary embodiment of the present disclosure.
Figure 18:
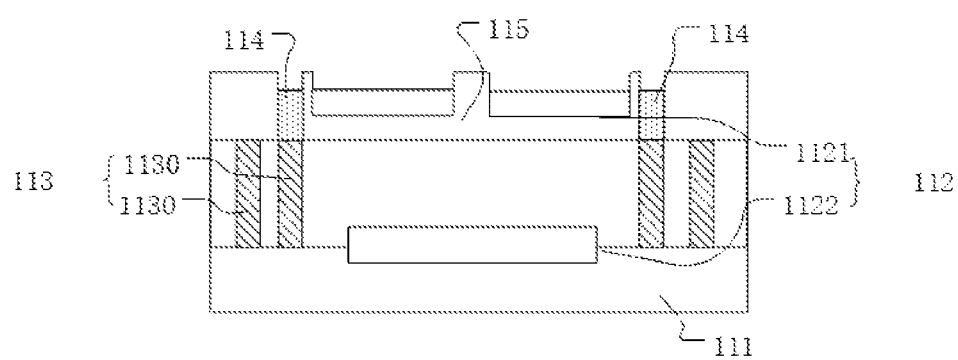
FIG. 18 is a schematic cross-sectional diagram of a chip structure according to one exemplary embodiment of the present disclosure.

As shown in FIG. 16, in the embodiments of the present disclosure, the chip structure 110 further includes a surface dielectric layer 115 located on the substrate 111. In some embodiments of the present disclosure, the auxiliary bonding region 114 is flush with the top surface of the surface dielectric layer 115. In other embodiments of the present disclosure, as shown in FIG. 17 and FIG. 18, the auxiliary bonding region 114 is higher than or lower than the surface dielectric layer 115.

Figure 19:
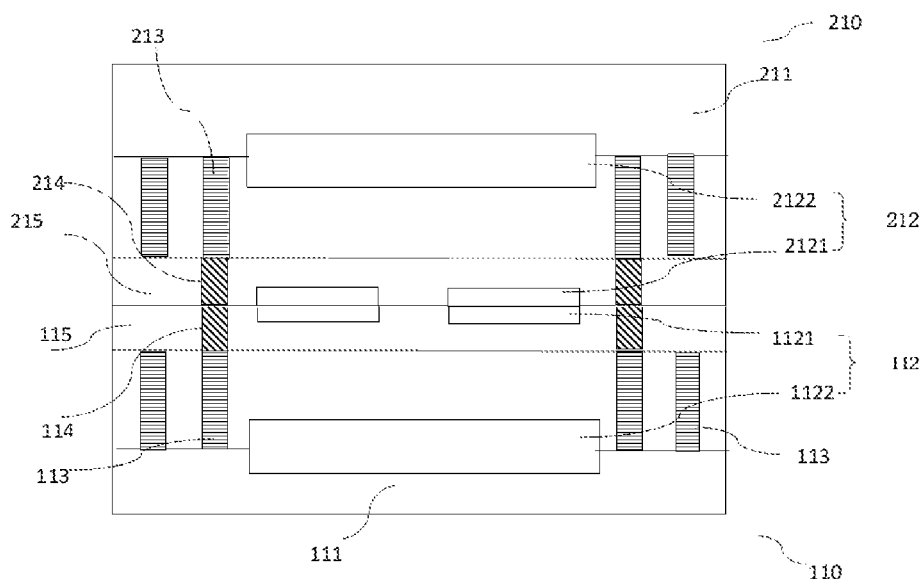
FIG. 19 is a schematic cross-sectional diagram of a semiconductor structure according to one exemplary embodiment of the present disclosure.
Figure 20:
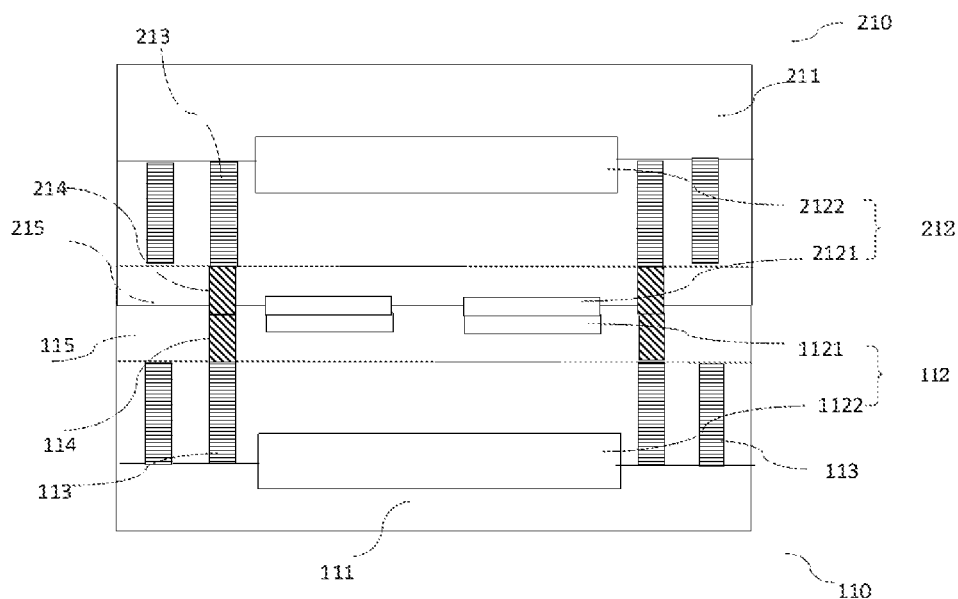
FIG. 20 is a schematic cross-sectional diagram of a semiconductor structure according to one exemplary embodiment of the present disclosure.

In an embodiment of the present disclosure, a semiconductor structure, as shown in FIG. 19, includes a first chip 110 and a second chip 210.

The first chip 110 includes: a first substrate 111; a first functional region 112 located on the first substrate 111; a first guard ring structure 113 surrounding the first functional region 112; a first auxiliary bonding region 114 located above the first guard ring structure 113, where there is an overlapping region between a projection of at least part of the first auxiliary bonding region 114 on the first substrate 111 and a projection of the first guard ring structure 113 on the first substrate 111; and a first surface dielectric layer 115 located on the first substrate 111, where the first auxiliary bonding region 114 is separated from the first functional region 112 by the first surface dielectric layer 115.

The first substrate 111 may be a semiconductor substrate, and for example, may be a silicon substrate, a silicon-germanium substrate, a carbon-silicon substrate, or the like.

Referring to FIG. 19, the first functional region 112 at least includes first internal bonding regions 1121 distributed on the surface of the first substrate 111, and a first circuit structure 1122 provided in the first chip 110. The first internal bonding regions 1121 are electrically connected to the first circuit structure 1122 (not shown in the figure).

The second chip 210 includes: a second substrate 211; a second functional region 212 located on the second substrate 211; a second guard ring structure 213 surrounding the second functional region 212; a second auxiliary bonding region 214 located above the second guard ring structure 213, where there is an overlapping region between a projection of at least part of the second auxiliary bonding region 214 on the second substrate 211 and a projection of the second guard ring structure 213 on the second substrate 211; and a second surface dielectric layer 215 located on the second substrate 211, where the second auxiliary bonding region 214 is separated from the second functional region 212 by the second surface dielectric layer 215.

The second substrate 211 may be a semiconductor substrate, and for example, may be a silicon substrate, a silicon-germanium substrate, a carbon-silicon substrate, or the like.

Referring to FIG. 19, the second functional region 212 at least includes second internal bonding regions 2121 distributed on the surface of the second substrate 211, and a second circuit structure 2122 provided in the second chip 210. The second internal bonding regions 2121 are electrically connected to the second circuit structure 2122 (not shown in the figure).

Referring to FIG. 19, in some embodiments of the present disclosure, the first chip 110 is aligned and connected to the second chip 210. At a stack interface of the first chip 110 and the second chip 210, for a first auxiliary bonding region 114 of the first chip 110 and a second auxiliary bonding region 214 of the second chip 210, one of both is higher than the surface dielectric layer of the semiconductor structure, and the other one of both is lower than the surface dielectric layer of the semiconductor structure.

At the stack interface of the first chip 110 and the second chip 210, the first internal bonding regions 1121 of the first chip 110 are bonded and connected to the second internal bonding regions 2121 of the second chip 210, the first surface dielectric layer 115 of the first chip 110 and the second surface dielectric layer 215 of the second chip 210 are subjected to dielectric bonding, and the first auxiliary bonding region 114 of the first chip 110 is bonded and connected to the second auxiliary bonding region 214 of the second chip 210. According to the semiconductor structure in this embodiment, the bonding strength of the peripheral region of the first internal bonding regions 1121 and the bonding strength of the peripheral region of the second internal bonding regions 2121 are enhanced by bonding and connecting the first auxiliary bonding region 114 to the second auxiliary bonding region 214.

Referring to FIG. 19, the internal bonding regions 1121 of the first chip 110 may be metal pads, and the first auxiliary bonding region 114 of the first chip 110 is made of metal. The second internal bonding regions 2121 of the second chip 210 may be metal pads, and the second auxiliary bonding region 214 of the second chip 210 is made of metal. The first auxiliary bonding region 114 of the first chip 110 is connected to the second auxiliary bonding region 214 of the second chip 210 by metal bonding. At the stack interface of the semiconductor structure in this embodiment, the first internal bonding regions 1121 and the second internal bonding regions 2121 are subjected to stronger metal bonding, and the first auxiliary bonding region 114 and the second auxiliary bonding region 214 surround the periphery of a metal functional bonding region for auxiliary metal bonding, to increase the bonding strength of the periphery of the metal functional bonding region.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the chip structure and the semiconductor structure provided in the embodiments of the present disclosure, the auxiliary bonding region is additionally arranged in the peripheral region of the functional region, the bonding capability of the peripheral region of the functional region of the chip structure is improved by providing the auxiliary bonding region, and the bonding strength of the stacked chip structure is further improved.

The invention claimed is:
1. A chip structure, comprising:
a substrate;
a functional region located on the substrate;
a guard ring structure surrounding the functional region; and
an auxiliary bonding region located above the guard ring structure, wherein there is an overlapping region between a projection of at least part of the auxiliary bonding region on the substrate and a projection of the guard ring structure on the substrate.

2. The chip structure according to claim 1, further comprising a scribe-line region, wherein the guard ring structure is located between the functional region and the scribe-line region; and
    a projection of part of the auxiliary bonding region on the substrate overlaps with a projection of the scribe-line region on the substrate.

3. The chip structure according to claim 2, wherein the auxiliary bonding region comprises a plurality of bonding portions, wherein there is an overlapping region between a projection of one part of the bonding portions on the substrate and a projection of the guard ring structure on the substrate; and
    a projection of a second part of the bonding portions on the substrate overlaps with the projection of the scribe-line region on the substrate.

4. The chip structure according to claim 1, wherein the guard ring structure comprises at least a circle of ring body, and the auxiliary bonding region comprises a bonding portion, wherein there is an overlapping region between a projection of one or more of the ring bodies on the substrate and a projection of the bonding portion on the substrate.

5. The chip structure according to claim 4, wherein the bonding portion comprises a first connecting portion extending along a thickness direction of the substrate; wherein
    the first connecting portion is provided with one end connected to the ring body and a second end comprising a bonding surface.

6. The chip structure according to claim 4, wherein the bonding portion comprises a second connecting portion extending along a thickness direction of the substrate, and a connecting layer parallel to the substrate; wherein
    the second connecting portion is provided with one end connected to the ring body and a second end connected to the connecting layer; and
    the connecting layer comprises a bonding surface located on a side of the connecting layer distant from the second connecting portion.

7. The chip structure according to claim 6, wherein the guard ring structure comprises a plurality of ring bodies, wherein the plurality of ring bodies comprise a first ring body arranged adjacent to the functional region; and
    the bonding portion corresponding to the first ring body comprises a first connecting layer spaced apart from an internal bonding region of the functional region.

8. The chip structure according to claim 7, wherein a projection region of the first connecting layer on the substrate is located within a projection region of the first ring body on the substrate.

9. The chip structure according to claim 7, further comprising a scribe-line region, wherein the plurality of ring bodies further comprise a second ring body arranged adjacent to the scribe-line region; and
    the bonding portion corresponding to the second ring body comprises a second connecting layer connected to the scribe-line region.

10. The chip structure according to claim 9, wherein a projection area of the second connecting layer on the substrate is greater than a projection area of the first connecting layer on the substrate; and
    along a width direction of the guard ring structure, a size of the second connecting layer is greater than a size of the first connecting layer.

11. The chip structure according to claim 4, wherein the bonding portion comprises a plurality of regular bending units sequentially connected end to end.

12. The chip structure according to claim 1, wherein the substrate has a center line, and the auxiliary bonding regions located on both sides of the center line are symmetrically arranged with the center line as a symmetry axis.

13. The chip structure according to claim 1, further comprising a surface dielectric layer located on the substrate, wherein
    the auxiliary bonding region is flush with a top surface of the surface dielectric layer.

14. The chip structure according to claim 1, further comprising a surface dielectric layer located on the substrate, wherein
    the auxiliary bonding region is lower than the surface dielectric layer; or, the auxiliary bonding region is higher than the surface dielectric layer.

15. A semiconductor structure, comprising a first chip and a second chip, wherein both the first chip and the second chip adopt the chip structure according to claim 1; and
    at a stack interface where the first chip and the second chip are connected, an auxiliary bonding region of the first chip is connected to an auxiliary bonding region of the second chip.

16. The semiconductor structure according to claim 15, wherein the auxiliary bonding region of the first chip is connected to the auxiliary bonding region of the second chip by metal bonding.

17. The semiconductor structure according to claim 16, wherein in the two auxiliary bonding regions connected at the stack interface, one of the two is higher than a surface dielectric layer of the semiconductor structure, and the other of the two is lower than the surface dielectric layer of the semiconductor structure.

\* \* \* \* \*